United States Patent
Song et al.

(10) Patent No.: US 7,737,456 B2
(45) Date of Patent: Jun. 15, 2010

(54) MULTIPLE REFLECTION LAYER ELECTRODE, COMPOUND SEMICONDUCTOR LIGHT EMITTING DEVICE HAVING THE SAME AND METHODS OF FABRICATING THE SAME

(75) Inventors: June-o Song, Yongin-si (KR); Tae-yeon Seong, Seoul (KR); Kyoung-kook Kim, Suwon-si (KR); Hyun-gi Hong, Gwanju-si (KR); Kwang-ki Choi, Suwon-si (KR); Hyun-soo Kim, Hwaseong-si (KR)

(73) Assignee: Samsung Electro-Mechanics Co., Ltd., Gyeonggi-do (KR)

( * ) Notice: Subject to any disclaimer, the term of this patent is extended or adjusted under 35 U.S.C. 154(b) by 322 days.

(21) Appl. No.: 11/808,172

(22) Filed: Jun. 7, 2007

(65) Prior Publication Data

US 2008/0093617 A1 Apr. 24, 2008

(30) Foreign Application Priority Data

Oct. 18, 2006 (KR) ...................... 10-2006-0101576

(51) Int. Cl.
*H01L 33/00* (2010.01)
*H01L 21/00* (2006.01)
(52) U.S. Cl. .......................................... 257/98; 438/29
(58) Field of Classification Search .................. 257/98, 257/102, 751, 86, 200, E33.001–E33.077, 257/E51.018–E51.022; 438/29
See application file for complete search history.

(56) References Cited

U.S. PATENT DOCUMENTS

| | | | |
|---|---|---|---|
| 6,194,743 B1 * | 2/2001 | Kondoh et al. | 257/94 |
| 6,573,537 B1 * | 6/2003 | Steigerwald et al. | 257/103 |
| 7,109,529 B2 * | 9/2006 | Uemura et al. | 257/99 |
| 7,372,081 B2 * | 5/2008 | Song et al. | 257/99 |
| 2005/0139825 A1 * | 6/2005 | Song et al. | 257/44 |
| 2005/0145876 A1 | 7/2005 | Kwak et al. | |
| 2005/0199895 A1 | 9/2005 | Seong et al. | |
| 2005/0276993 A1 * | 12/2005 | Sohn et al. | 428/690 |
| 2009/0047509 A1 * | 2/2009 | Gagliardi et al. | 428/336 |

FOREIGN PATENT DOCUMENTS

| | | |
|---|---|---|
| CN | 1638161 | 7/2005 |
| CN | 1677703 | 10/2005 |

(Continued)

OTHER PUBLICATIONS

Korean Office Action dated Apr. 29, 2008 in corresponding Korean Patent Application No. 10-2006-0101576.

(Continued)

*Primary Examiner*—Calvin Lee
(74) *Attorney, Agent, or Firm*—Harness, Dickey & Pierce, P.L.C.

(57) ABSTRACT

Provided are a multiple reflection layer electrode, a compound semiconductor light emitting device having the same and methods of fabricating the same. The multiple reflection layer electrode may include a reflection layer on a p-type semiconductor layer, an APL (agglomeration protecting layer) on the reflection layer so as to prevent or retard agglomeration of the reflection layer, and a diffusion barrier between the reflection layer and the APL so as to retard diffusion of the APL.

22 Claims, 4 Drawing Sheets

FOREIGN PATENT DOCUMENTS

| | | |
|---|---|---|
| JP | 11-220171 | 8/1999 |
| KR | 10-2005-0064195 | 6/2005 |
| KR | 10-2005-0096582 | 10/2005 |
| KR | 10-0635157 | 10/2006 |
| WO | WO 2006/006822 | 1/2006 |

OTHER PUBLICATIONS

Chinese Office Action dated Mar. 1, 2010 in corresponding Chinese Application No. 200701051890, with English translation.

* cited by examiner

MULTIPLE REFLECTION LAYER ELECTRODE, COMPOUND SEMICONDUCTOR LIGHT EMITTING DEVICE HAVING THE SAME AND METHODS OF FABRICATING THE SAME

PRIORITY STATEMENT

This application claims priority under 35 U.S.C. §119 to Korean Patent Application No. 10-2006-0101576, filed on Oct. 18, 2006, in the Korean Intellectual Property Office (KIPO), the entire contents of which are incorporated herein by reference.

BACKGROUND

1. Field

Example embodiments relate to a multiple reflection layer electrode of a semiconductor device, a compound semiconductor light emitting device having the same and methods of fabricating the same. Other example embodiments relate to a multiple reflection layer electrode having improved thermal stability and ohmic contact characteristics, a compound semiconductor light emitting device having the same and methods of fabricating the same.

2. Description of the Related Art

Figure 1:
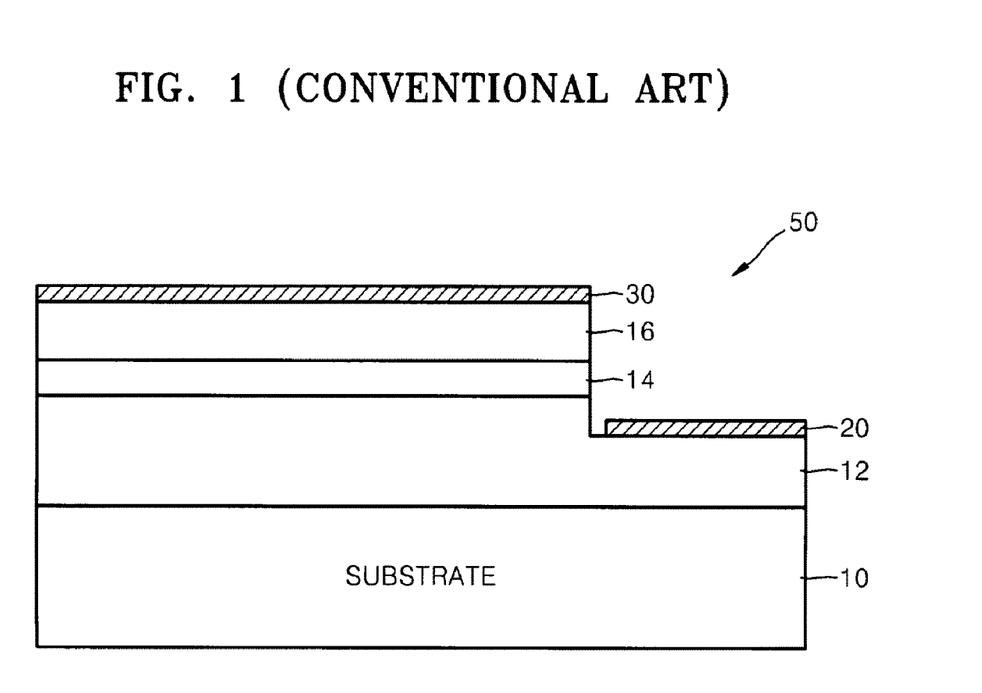
FIG. 1 is a schematic cross-sectional view of a structure of a conventional compound semiconductor light emitting device.
Figure 2:
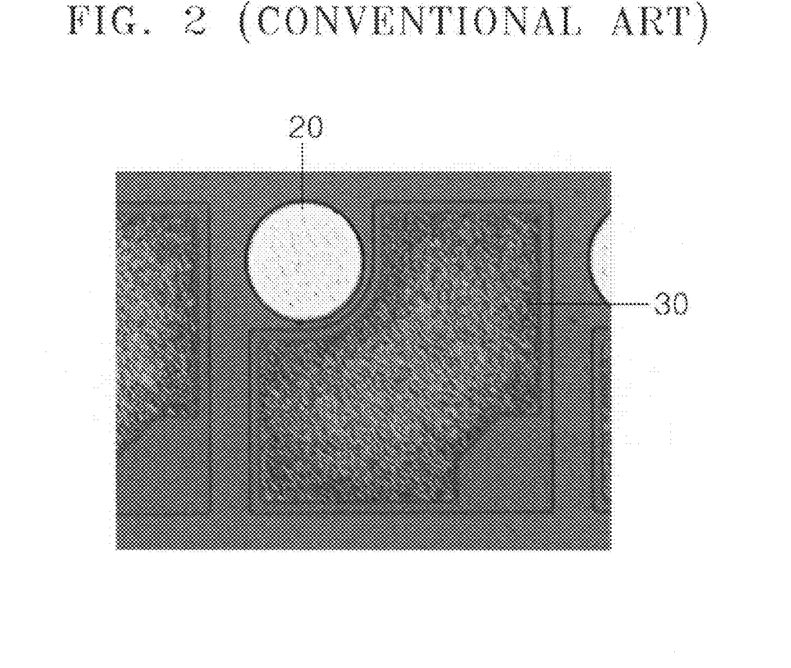
FIG. 2 is a photograph showing a surface of the compound semiconductor LED of FIG. 1 on which a p-type electrode is annealed.
Figure 3:
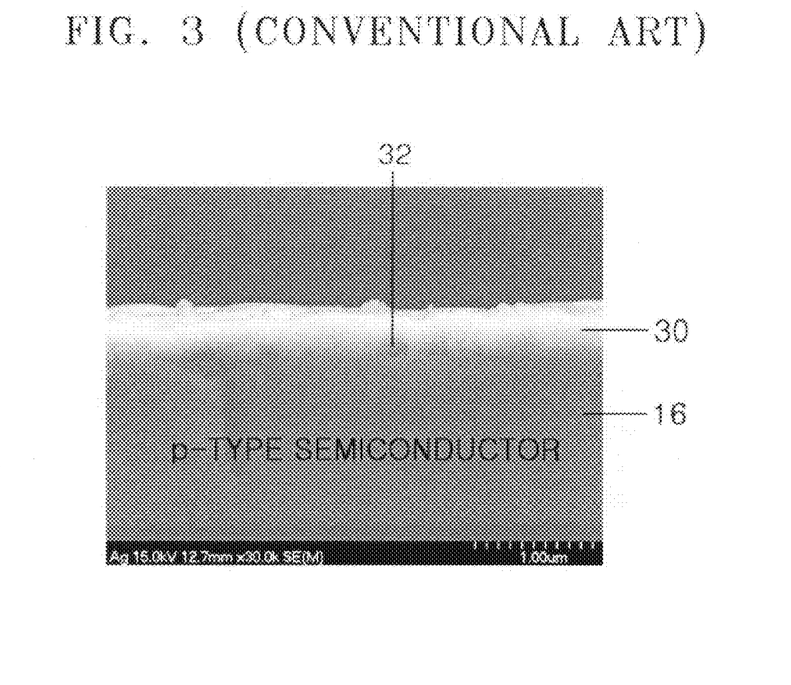
FIG. 3 is a scanning electronic microscope (SEM) cross-sectional photo showing agglomeration of the annealed p-type electrode and voids formed in the p-type electrode as a result of agglomeration.

FIG. 1 is a cross-sectional view of a structure of a conventional compound semiconductor light emitting device (LED) 50 and a conventional p-type electrode 30 formed on a p-type nitride semiconductor layer 16. FIG. 2 is a photograph showing the surface of the compound semiconductor LED on which the p-type electrode 30 is annealed, and FIG. 3 is a scanning electronic microscope (SEM) cross-sectional photo showing agglomeration of the annealed p-type electrode 30 and voids 32 formed in the p-type electrode 30 as a result of agglomeration.

Referring to FIG. 1, the conventional semiconductor LED 50 may include an n-type nitride semiconductor layer 12, an active layer 14, and a p-type nitride semiconductor layer 16, which are sequentially formed on a sapphire substrate 10, an n-type electrode 20 formed on one side of the n-type nitride semiconductor layer 12, and a p-type electrode 30 formed on the p-type nitride semiconductor layer 16. If forward voltages are applied to LED electrodes, for example, the n-type electrode 20 and the p-type electrode 30, electrons in a conduction band of the active layer 14 may be recombined with holes in a valence band and light may be emitted from the active layer 14 due to energy corresponding to a band gap, which is the energy difference between the valance band and the conduction band. Light emitted from the active layer 14 may be reflected by the p-type electrode 30 and may be emitted to the outside of the semiconductor LED 50 through the sapphire substrate 10.

In an LED in which light generated from the semiconductor LED 50 is not directly emitted onto the sapphire substrate 10, but is reflected by the p-type electrode 30 and emitted through the sapphire substrate 10 (hereinafter, referred to as a flip-chip LED), because the p-type electrode 30 may reflect light, the p-type electrode 30 may be formed of a conductive metal having increased reflectivity, e.g., Ag.

A semiconductor having a relatively large direct bandgap energy (about 2.8 eV or more) may be essential for blue light emission. Semiconductor devices, which emit a blue or green light by primarily using a Group II-VI ternary system material, have been developed. However, due to a relatively short operating time, there are problems in applying semiconductor devices. Recently, semiconductor devices for blue light emission have been studied in Group III-V semiconductors. Among them, Group III nitride (for example, a compound related to GaN) semiconductors may be relatively stable to optical, electrical, and thermal stimulus and may have an increased luminous efficiency.

As illustrated in FIG. 1, in an LED that uses a Group-III nitride semiconductor, e.g., GaN, as a semiconductor light emitting device, for improvement in light extraction efficiency, the p-type electrode 30 may be formed of a metal having increased reflectivity, e.g., Ag, on the p-type nitride semiconductor layer 16. In order to form the p-type electrode 30 on the p-type nitride semiconductor layer 16, an electrode may be deposited on the p-type nitride semiconductor layer 16 and then, annealing may be necessary for reduction in resistance.

However, in general, a surface energy of a nitride semiconductor and a surface energy of a metal material, e.g., Ag, used in forming the p-type electrode 30 may be different from each other. Due to the difference in surface energies, agglomeration may occur in the p-type electrode 30 during annealing, as shown in the photographs of FIGS. 2 and 3. FIG. 2 is a plan-view of a captured image of the n-type electrode 20 and p-type electrode 30 in which surface agglomeration occurs after annealing, and FIG. 3 is an SEM cross-sectional photo of the p-type electrode 30 in which agglomeration occurs after annealing. As shown in FIGS. 2 and 3, a plurality of voids 32 may be formed at an interface between the p-type nitride semiconductor layer 16 and the p-type electrode 30. When agglomeration occurs in the p-type electrode 30, a plurality of voids 32 may be formed. As a result, reflectivity of the Ag electrode 30 may be lowered and an optical output of the entire LED may be reduced.

SUMMARY

Example embodiments provide a nitride-based semiconductor light emitting device which prevents or retards agglomeration from occurring in a p-type electrode when a semiconductor light emitting device is manufactured, thereby suppressing the lowering of an optical output of a light emitting device (LED) using a nitride semiconductor and showing increased brightness.

According to example embodiments, a multiple reflection layer electrode may include a reflection layer on a p-type semiconductor layer, an APL (agglomeration protecting layer) on the reflection layer so as to prevent or retard agglomeration of the reflection layer, and a diffusion barrier between the reflection layer and the APL so as to prevent or retard diffusion of the APL.

The multiple reflection layer electrode may further include a contact electrode layer between the p-type semiconductor layer and the reflection layer so as to reduce a contact resistance between the p-type semiconductor layer and the reflection layer. The contact electrode layer may be formed of at least one material selected from the group consisting of a La-based alloy, an Ni-based alloy, a Zn-based alloy, a Cu-based alloy, a thermoelectric oxide, a doped In oxide, ITO, and ZnO. The reflection layer may be formed of one material selected from the group consisting of Ag, an Ag-based alloy, and an Ag-based oxide. The Ag-based alloy may include at least one element selected from the solute-element group consisting of Al, Rh, Cu, Pd, Ni, Ru, Ir, and Pt.

The diffusion barrier may be formed of a transparent conductive material. The transparent conductive material may include at least one material selected from the group consisting of Ti—N, Mo—O, Ru—O, Ir—O, and In—O. The In—O further may include at least one dopant selected from the group consisting of Sn, Zn, Ga, Cu, and Mg. A content of a dopant added to the In—O may be about 0.1-about 49 atomic %.

The diffusion barrier may prevent or retard the effect of thermal stability of the Ag-based reflection layer and an ohmic contact characteristic caused by a material of another layer excluding the reflection layer diffused toward the reflection layer. As a result, the diffusion barrier may prevent or retard voids from being formed at an interface between a nitride-based semiconductor layer and the Ag-based reflection layer and may prevent or retard surface agglomeration from occurring. The APL may be formed of Al or an Al-based alloy so as to prevent or retard agglomeration of the reflection layer. The Al-based alloy may include at least one element selected from the solute-element group consisting of Ag, Rh, Cu, Pd, Ni, Ru, Ir, and Pt.

According to example embodiments, a multiple reflection layer electrode may further include an oxidation protecting layer formed on the APL so as to prevent or retard oxidation of the APL. A difference in surface energy between the material of the diffusion barrier and the material of the p-type semiconductor layer may be smaller than a difference in surface energy between the material of the reflection layer and the material of the p-type semiconductor layer. The oxidation protecting layer may be formed of at least one material selected from the group consisting of Au, Rh, Pd, Cu, Ni, Ru, Ir, and Pt. The oxidation protecting layer may be formed in a single layer or multiple layer structure.

According to example embodiments, a compound semiconductor light emitting device may include an n-type electrode, an n-type semiconductor layer, an active layer, a p-type semiconductor layer; and a p-type electrode, wherein the p-type electrode is the multiple reflection layer electrode of example embodiments.

According to example embodiments, a method of fabricating a multiple reflection layer electrode may include forming a reflection layer on a p-type semiconductor layer, forming an APL (agglomeration protecting layer) on the reflection layer so as to retard agglomeration of the reflection layer, and forming a diffusion barrier between the reflection layer and the APL so as to retard diffusion of the APL.

The method may further include forming an oxidation protecting layer on the APL so as to retard oxidation of the APL. Forming the reflection layer may include forming one material selected from the group consisting of Ag, an Ag-based alloy, and an Ag-based oxide. The Ag-based alloy may include at least one element selected from the solute-element group consisting of Al, Rh, Cu, Pd, Ni, Ru, Ir, and Pt. Forming the diffusion barrier may include forming a transparent conductive material. The transparent conductive material may include at least one material selected from the group consisting of Ti—N, Mo—O, Ru—O, Ir—O, and In—O. Forming the APL may include forming an Al or an Al-based alloy. The Al-based alloy may include at least one element selected from the solute-element group consisting of Ag, Rh, Cu, Pd, Ni, Ru, Ir, and Pt. Forming the oxidation protecting layer may include forming at least one material selected from the group consisting of Au, Rh, Pd, Cu, Ni, Ru, Ir, and Pt.

The method may further include forming a contact electrode layer between the p-type semiconductor layer and the reflection layer and reducing a contact resistance between the p-type semiconductor layer and the reflection layer. Forming the contact electrode layer may include forming at least one material selected from the group consisting of a La-based alloy, an Ni-based alloy, a Zn-based alloy, a Cu-based alloy, a thermoelectric oxide, a doped In oxide, ITO, and ZnO.

According to example embodiments, a method of fabricating a compound semiconductor light emitting device may include forming an n-type nitride semiconductor layer, an active layer, and the p-type nitride semiconductor layer on a substrate, forming an n-type electrode on one side of the n-type nitride semiconductor layer, and forming a p-type electrode on the p-type nitride semiconductor layer, wherein the p-type electrode is the multiple reflection layer electrode of example embodiments.

BRIEF DESCRIPTION OF THE DRAWINGS

Example embodiments will be more clearly understood from the following detailed description taken in conjunction with the accompanying drawings. FIGS. 1-6 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the attached drawings, in which example embodiments are shown. Example embodiments may, however, be embodied in many different forms and should not be construed as being limited to the embodiments set forth herein. Rather, these embodiments are provided so that this disclosure will be thorough and complete, and will fully convey the scope of example embodiments to those skilled in the art. In the drawings, the thicknesses of layers and regions are exaggerated for clarity. Like numbers refer to like elements throughout the specification.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/ or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
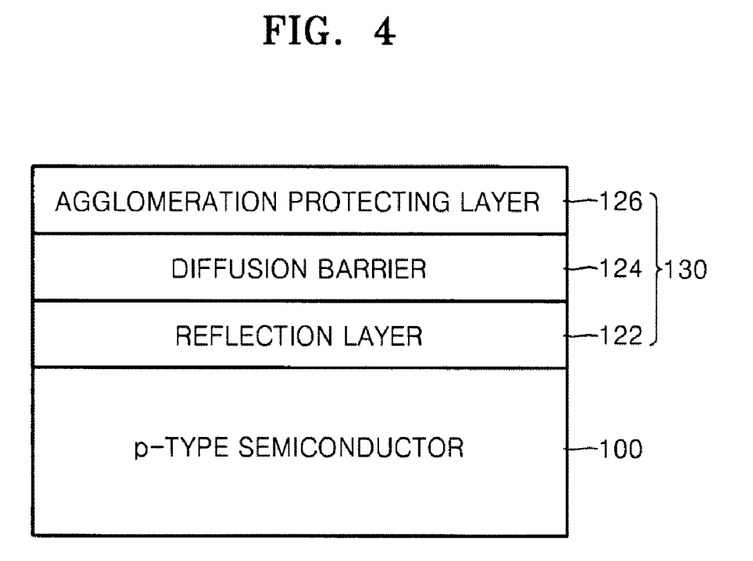
FIG. 4 is a cross-sectional view of a structure of a multiple reflection layer electrode according to example embodiments.

FIG. 4 is a cross-sectional view of a structure of a multiple reflection layer electrode (a p-type electrode) according to example embodiments. Referring to FIG. 4, a multiple reflection layer electrode 130, according to example embodiments, may include a reflection layer 122, a diffusion barrier 124, and an agglomeration protecting layer (APL) 126, which are sequentially stacked on a p-type nitride semiconductor layer 100.

The reflection layer 122 may be formed of a material having an improved light reflection characteristic and may reflect light incident on the reflection layer 122. The reflection layer 122 may be formed of silver (Ag), an Ag-based alloy and/or an Ag-based oxide in the form of Ag—O. The Ag-based alloy may include at least one element selected from the solute-element group consisting of aluminum (Al), rhodium (Rh), copper (Cu), palladium (Pd), nickel (Ni), ruthenium (Ru), iridium (Ir), and platinum (Pt). In order to reduce a contact resistance between the p-type nitride semiconductor layer 100 and the reflection layer 122, the reflection layer 122 may be a reflective ohmic contact layer having both light reflection characteristics and ohmic contact characteristics.

The APL 126 may prevent or retard agglomeration of the reflection layer 122. The APL 126 may be formed of Al and/or an Al-based alloy. The Al-based alloy may include at least one element selected from the solute-element group consisting of Ag, Rh, Cu, Pd, Ni, Ru, Ir, and Pt. The diffusion barrier 124 may be interposed between the reflection layer 122 and the APL 126 and may prevent or retard a material used in forming the APL 126 from being diffused toward the reflection layer 122. The diffusion barrier 124 may be formed of a transparent conductive material. The transparent conductive material may include at least one material selected from the group consisting of a titanium nitride (Ti—N), a molybdenum oxide (Mo—O), a ruthenium oxide (Ru—O), an iridium oxide (Ir—O), and an indium oxide (In—O). The In—O may further include at least one dopant selected from the group consisting of tin (Sn), zinc (Zn), gallium (Ga), copper (Cu), and magnesium (Mg). The content of the dopant added to the In—O may be about 0.1-about 49 atomic % so that an ohmic contact characteristic of the diffusion barrier 124 may be improved.

In FIG. 4, each of the reflection layer 122, the diffusion barrier 124, and the APL 126 may be formed to a thickness of about 1 nm-about 1000 nm. When the thickness of the APL 126 is larger, an electrical resistance may be increased. When the thickness of the APL 126 is smaller, an agglomeration protecting effect may be reduced and the thickness of the APL 126 may be properly adjusted. The thickness of the APL 126 may be determined in consideration of the size of the entire semiconductor device and the thickness of the reflection layer 122. For example, the thickness of the reflection layer 122 may range from about 50 nm to about 1000 nm, e.g., about 200 nm. When the thickness of the reflection layer 122 is about 200 nm, the thickness of the APL 126 may be within about 1 nm-about 200 nm. For example, the thickness of the APL 126 may be about 100 nm-about 200 nm. The thickness of the diffusion barrier 124 may be about 50 nm-about 100 nm.

After the reflection layer 122, the diffusion barrier 124, and the APL 126 may be sequentially deposited, the stack resultant structure may be annealed at about 300° C.-about 600° C.

Respective material layers may be formed using vapor deposition that is generally used in a semiconductor manufacturing process, for example, chemical vapor deposition (CVD), metal-organic chemical vapor deposition (MOCVD) and/or physical vapor deposition (PVD), or using an e-beam evaporator.

Characteristics of the multiple reflection layer electrode (p-type electrode) illustrated in FIG. 4 will now be described in greater detail. Because the surface energy of the material of the reflection layer 122, e.g., Ag, an Ag-based alloy and/or an Ag-based oxide in the form of Ag—O, is different from the surface energy of a material of the p-type nitride semiconductor layer 100, agglomeration may occur during annealing after the reflection layer 122 is stacked. In FIG. 4, in order to prevent or retard agglomeration, the APL 126, formed of a conductive material, whose surface energy difference between the surface energy of the material of the p-type nitride semiconductor layer 100 is relatively small, for example, Al or an Al-based alloy, may be stacked on the reflection layer 122. The Al-based alloy may include at least one material selected from the solute-metal group consisting of Ag, Rh, Cu, Pd, Ni, Ru, Ir, and Pt.

Because these selected materials have a relatively small surface energy difference between the surface energy of the material of the p-type nitride semiconductor layer 100 and also have improved electrical conductivity, the materials may be stacked on the reflection layer 122, may perform an agglomeration protecting function and may serve as an electrode. In a stacking method of the APL 126, a metal vapor of a reflection layer material, generated by an e-beam using a general e-beam evaporator and a metal vapor of an agglomeration protecting layer material, may be sequentially exposed to a substrate and therefore may be stacked in a multiple thin film structure. Annealing may be performed at about 300° C.-about 600° C. for about 5 minutes.

Annealing may be performed in an atmosphere including at least oxygen. Annealing time and atmosphere may not be as important in example embodiments, but annealing may be performed for about 30 minutes or more. When the APL 126 is stacked on the reflection layer 122, a difference between the surface energy of the material of the APL 126 and the surface energy of the material of the p-type nitride semiconductor layer 100 may be relatively small. Thus, deformation, which may occur during subsequent annealing, may be generated similarly in the APL 126 and the p-type nitride semiconductor layer 100. Thus, the APL 126 may prevent or retard the reflection layer 122 from being agglomerated during annealing so that the surface of the reflection layer 122 may be kept in a flat state. However, on the other hand, when the APL 126 is stacked on the reflection layer 122 and is annealed, a portion of the material used in forming the APL 126 may be diffused toward the reflection layer 122 and thermal stability and ohmic contact characteristic of the Ag-based reflection layer 122 may be adversely affected.

Thus, a layer, which prevents or retards diffusion between the APL 126 and the reflection layer 122 without disturbing the function of the APL 126, may be needed. Thus, in order to meet this requirement, the diffusion barrier 124 may be additionally interposed between the reflection layer 122 and the APL 126, as illustrated in FIG. 4. As such, thermal stability and ohmic contact characteristic of the reflection layer 122 may be improved compared to the related art. In addition, the diffusion barrier 124 may prevent or retard voids from being formed at an interface between the p-type nitride semiconductor layer 100 and the Ag-based reflection layer 122 and may also prevent or retard surface agglomeration from occurring.

If agglomeration of the reflection layer 122 and impurity material diffusion from another electrode layer to the reflection layer 122 are prevented or retarded, reflectivity of the reflection layer 122 may not be lowered and a high-reflection state may be maintained. Because the semiconductor light emitting device having the multiple reflection layer electrode 130 manufactured according to FIG. 4 may have reduced reflectivity, improvement in light output characteristic may be expected.

When only the diffusion barrier 124 and the APL 126 are formed on the reflection layer 122, the entire contact resistance of the multiple reflection layer electrode 130 may be increased. Thus, an additional electrode, which may reduce a contact resistance, may be interposed between the p-type nitride semiconductor layer 100 and the reflection layer 122. A contact electrode layer (not shown), which reduces a contact resistance between the p-type semiconductor layer 100 and the reflection layer 122, may be further interposed between the p-type nitride semiconductor layer 100 and the reflection layer 122.

Light generated from the p-type nitride semiconductor light emitting device may pass through the contact electrode layer (not shown) and may reach the reflection layer 122. In addition, because light reflected from the reflection layer 122 may again pass through the contract electrode layer (not shown), the contact electrode layer (not shown) may have increased transparency. Thus, in order to meet this requirement, the contact electrode layer (not shown) may be formed of at least one material selected from the group consisting of a La-based alloy, an Ni-based alloy, a Zn-based alloy, a Cu-based alloy, a thermoelectric oxide, a doped In oxide, ITO, and ZnO, for example, a Zn—Ni alloy, an Ni—Mg alloy, and a Zn—Mg alloy. A doping element of the doped In oxide may include at least one selected from the group consisting of Mg, Ag, Zn, Sc, Hf, Zr, Te, Se, Ta, W, Nb, Cu, Si, Ni, Co, Mo, Cr, Mn, Hg, Pr, and La.

The contact electrode layer (not shown) may be formed to a thickness of about 0.1 nm-about 200 nm. If the thickness of the contact electrode layer is larger, the entire reflectivity may be lowered, and if the thickness of the contact electrode layer is smaller, a stacking effect may be lowered. Thus, the thickness of the contact electrode layer may be properly adjusted. The thickness of the contact electrode layer (not shown) may be determined in consideration of the size of the entire semiconductor device and the thickness of the reflection layer 122. For example, when the thickness of the reflection electrode layer 122 is about 200 nm, the thickness of the contact electrode layer may be about 1 nm-about 200 nm. For example, the thickness of the contact electrode layer may be about 3 nm. After the contact electrode layer (not shown), the reflection layer 122, the diffusion barrier 124 and the APL 126 are sequentially stacked, the stack resultant structure may be annealed at about 300° C.-about 600° C.

Figure 5:
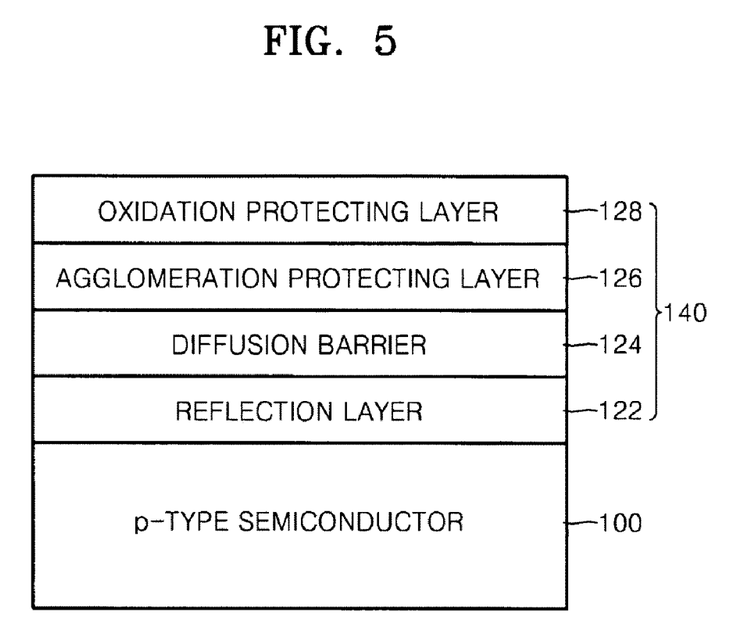
FIG. 5 is a cross-sectional view of a structure of a multiple reflection layer electrode according to example embodiments.

FIG. 5 is a cross-sectional view of a structure of a multiple reflection layer electrode according to example embodiments. Referring to FIG. 5, a multiple reflection layer electrode 140 may include a reflection layer 122, a diffusion barrier 124, an agglomeration protecting layer (APL) 126, and an oxidation protecting layer 128, which are sequentially stacked on a p-type nitride semiconductor layer 100. Functions of the reflection layer 122, the diffusion barrier 124, and the APL 126, materials used in forming them, and methods of forming the same have been already described and thus, repeated descriptions thereof will be omitted.

When a metal material, e.g., Cu, is used in forming the APL 126, a current-voltage characteristic of an electrode may be deteriorated due to oxidation of the surface of the APL 126. In order to prevent or retard agglomeration that occurs in the reflection layer 122, the diffusion barrier 124 and the APL 126 may be formed on the reflection layer 122 and agglomeration on the surface of the reflection layer 122 may decrease. However, the surface of the APL 126 may be partially oxidized. If the surface of the APL 126 is oxidized, the current-voltage characteristic of the electrode may be deteriorated so that an operating voltage of a compound semiconductor light emitting device may be increased.

Such oxidation may cause a problem in mass-production of semiconductor light emitting devices. In order to suppress surface oxidation of the APL 126, the oxidation protecting layer 128 may be additionally formed on the APL 126. For example, the oxidation protecting layer 128 may be stacked on the APL 126 and may suppress oxidation of the APL 126. Thus, the oxidation protecting layer 128 may be further formed on the APL 126 so that agglomeration of the reflection layer 122 may be suppressed, which is the function of the APL 126. Oxidation of the APL 126 may be suppressed, which is the function of the oxidation protecting layer 128.

The oxidation protecting layer 128 may be formed of at least one material selected from the group consisting of Au, Rh, Pd, Cu, Ni, Ru, Ir, and Pt, and the oxidation protecting layer 128 may be formed in a single layer or multiple layer structure. The oxidation protecting layer 128 may be formed to a thickness of about 1 nm-about 1000 nm, for example, about 20 nm-about 500 nm.

After the reflection layer 122, the diffusion barrier 124, the APL 126, and the oxidation protecting layer 128 may be sequentially stacked on the p-type nitride semiconductor layer 100, the stack resultant structure may be annealed at about 300° C.-about 600° C. A contact electrode layer (not shown), which reduces a contact resistance between the p-type semiconductor layer 100 and the reflection layer 122, may be further interposed between the p-type nitride semiconductor layer 100 and the reflection layer 122. The contact electrode layer (not shown) may be formed to a thickness of about 0.1-about 200 nm. A material used in forming the contact electrode layer (not shown) has already been described and thus, a detailed description thereof will be omitted. After the contact electrode layer (not shown), the reflection layer 122, the diffusion barrier 124, the APL 126, and the oxidation protecting layer 128 are sequentially stacked on the p-type nitride semiconductor layer 100, the stack resultant structure may be annealed at about 300° C.-about 600° C.

Figure 6:
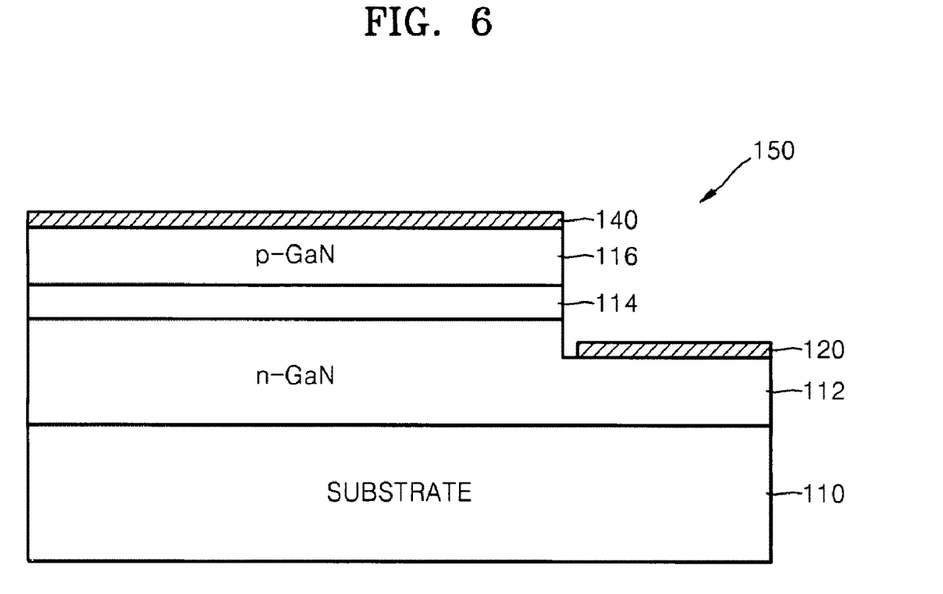
FIG. 6 is a schematic cross-sectional view of a compound semiconductor light emitting device having a multiple reflection layer electrode according to example embodiments.

FIG. 6 is a schematic cross-sectional view of a compound semiconductor light emitting device having a multiple reflection layer electrode according to example embodiments. A compound semiconductor light emitting device 150 having a multiple reflection layer electrode 140 is illustrated in FIG. 6. For example, the compound semiconductor light emitting device 150 may include an n-type semiconductor layer 112, an active layer 114, and a p-type semiconductor layer 116, which are sequentially stacked on a substrate 110. The compound semiconductor light emitting device 150 may further include an n-type electrode 120 formed on an etch surface of the n-type semiconductor layer 112 and a p-type electrode 140 formed on the p-type semiconductor layer 116. The multiple reflection layer electrode 140 illustrated in FIG. 5 may be used as the p-type electrode 140.

The p-type electrode 140 may include a reflection layer 122, a diffusion barrier 124, an agglomeration protecting layer (APL) 126, and an oxidation protecting layer 128, which are sequentially stacked on the p-type semiconductor layer 116. Detailed structure and description of the multiple reflection layer electrode 140 illustrated in FIG. 5 have been already described and thus, repeated description thereof will be omitted. The substrate 110 may be one of Si, GaAs, SiC, GaN, and sapphire substrates. The n-type semiconductor layer 112 may be an n-GaN-based Group III-V nitride semiconductor layer, for example, an n-GaN layer or an n-GaN/AlGaN layer. The p-type semiconductor layer 116 may be a p-GaN-based Group III-V nitride semiconductor layer, for example, a p-GaN layer or a p-GaN/AlGaN layer.

The active layer 114 may be a GaN-based Group III-V nitride semiconductor layer, which is formed of $In_xAl_yGa_{1-x-y}N$ (about $0 \leqq x \leqq 1$, about $0 \leqq y \leqq 1$ and about $0 \leqq x+y \leqq 1$), for example, an InGaN layer or an AlGaN layer. The active layer 114 may have one of a multiple quantum well (MQW) and a single quantum well, and the structure of the active layer 114 may not restrict the technical scope of example embodiments. For example, the active layer 114 may be formed in a GaN/InGaN/GaN MQW or GaN/AlGaN/GaN MQW structure.

In the structure of the compound semiconductor light emitting device according to example embodiments, if forward voltages are applied between the n-type electrode 120 and the p-type electrode 140, electrons in a conduction band of the active layer 114 may be recombined with holes in a valence band and light may be emitted from the active layer 114 due to energy corresponding to a band gap, which is the energy difference between the valance band and the conduction band. Light emitted from the active layer 114 may be reflected by the p-type electrode 140 and may be emitted to the outside of the semiconductor light emitting device 150 through the substrate 110.

In the compound semiconductor light emitting device according to example embodiments, the n-type electrode 120 may be formed of a metal material, e.g., Al, Ag, Au and/or Pd. In addition, a multiple reflection layer electrode, according to example embodiments, may be used as the n-type electrode 120. In other words, the n-type electrode 120 may include a reflection layer 122, a diffusion barrier 124, an APL 126, and an oxidation protecting layer 128, which are sequentially stacked on the n-type semiconductor layer 112. Because the compound semiconductor light emitting device having the multiple reflection layer electrode 140 according to example embodiments has reduced reflectivity, improvement in light output characteristics may be expected.

According to example embodiments, a multiple reflection layer electrode having improved thermal stability and ohmic contact characteristic and a compound semiconductor light emitting device having the same may be obtained. According to example embodiments, a diffusion barrier and an agglomeration protecting layer (APL) may be used such that agglomeration may be prevented or retarded from occurring on the surface of a reflection layer. For example, the diffusion barrier may prevent or retard a material excluding the reflection layer from being diffused toward the reflection layer such that thermal stability and ohmic contact characteristic of the reflection layer may be improved.

In addition, an oxidation protecting layer may be stacked on the APL such that oxidation of the APL may be prevented or retarded. Thus, according to example embodiments, an electrode for a semiconductor light emitting device having a relatively low electrical resistance may be obtained and a semiconductor light emitting device having relatively small power consumption may be obtained. In addition, according to example embodiments, stable mass-production of semiconductor light emitting devices may be possible.

While example embodiments have been particularly shown and described with reference to example embodiments thereof, it will be understood by those of ordinary skill in the art that various changes in form and details may be made therein without departing from the spirit and scope of the following claims.

What is claimed is:

1. A multiple reflection layer electrode comprising:
   a reflection layer on a p-type semiconductor layer;
   an APL (agglomeration protecting layer) on the reflection layer so as to retard agglomeration of the reflection layer; and
   a diffusion barrier between the reflection layer and the APL so as to retard diffusion of the APL; a contact electrode layer between the p-type semiconductor layer and the reflection layer and reducing a contact resistance between the p-type semiconductor layer and the reflection layer.

2. The multiple reflection layer electrode of claim 1, further comprising:
   an oxidation protecting layer formed on the APL so as to retard oxidation of the APL.

3. The multiple reflection layer electrode of claim 2, wherein the oxidation protecting layer is formed of at least one material selected from the group consisting of Au, Rh, Pd, Cu, Ni, Ru, Ir, and Pt.

4. The multiple reflection layer electrode of claim 3, wherein the oxidation protecting layer is formed in a single layer or multiple layer structure.

5. The multiple reflection layer electrode of claim 2, wherein a thickness of the oxidation protecting layer is about 1 nm-about 1000 nm.

6. The multiple reflection layer electrode of claim 2, wherein a stack resultant structure composed of the reflection layer, the diffusion barrier, the APL, and the oxidation protecting layer is annealed at about 300° C.-about 600° C.

7. The multiple reflection layer electrode of claim 1, wherein the reflection layer is a reflective ohmic contact layer.

8. The multiple reflection layer electrode of claim 1, wherein the reflection layer is formed of one material selected from the group consisting of Ag, an Ag-based alloy, and an Ag-based oxide.

9. The multiple reflection layer electrode of claim 8, wherein the Ag-based alloy includes at least one element selected from the solute-element group consisting of Al, Rh, Cu, Pd, Ni, Ru, Ir, and Pt.

10. The multiple reflection layer electrode of claim 1, wherein the diffusion barrier is formed of a transparent conductive material.

11. The multiple reflection layer electrode of claim 10, wherein the transparent conductive material includes at least one material selected from the group consisting of Ti—N, Mo—O, Ru—O, Ir—O, and In—O.

12. The multiple reflection layer electrode of claim 11, wherein the In—O further includes at least one dopant selected from the group consisting of Sn, Zn, Ga, Cu, and Mg.

13. The multiple reflection layer electrode of claim 12, wherein a content of a dopant added to the In—O is about 0.1-about 49 atomic %.

14. The multiple reflection layer electrode of claim 1, wherein the APL is formed of Al or an Al-based alloy.

15. The multiple reflection layer electrode of claim 14, wherein the Al-based alloy includes at least one element selected from the solute-element group consisting of Ag, Rh, Cu, Pd, Ni, Ru, Ir, and Pt.

16. The multiple reflection layer electrode of claim 1, wherein the contact electrode layer is formed of at least one material selected from the group consisting of a La-based alloy, an Ni-based alloy, a Zn-based alloy, a Cu-based alloy, a thermoelectric oxide, a doped In oxide, ITO, and ZnO.

17. The multiple reflection layer electrode of claim 16, wherein a doping element in the doped In oxide includes at least one selected from the group consisting of Mg, Ag, Zn, Sc, Hf, Zr, Te, Se, Ta, W, Nb, Cu, Si, Ni, Co, Mo, Cr, Mn, Hg, Pr, and La.

18. The multiple reflection layer electrode of claim 16, wherein a thickness of the contact electrode layer is about 0.1 nm-about 200 nm.

19. The multiple reflection layer electrode of claim 16, wherein a stack resultant structure composed of the contact electrode layer, the reflection layer, the diffusion barrier, the APL, and the oxidation protecting layer is annealed at about 300° C.-about 600° C.

20. The multiple reflection layer electrode of claim 1, wherein a thickness of each of the reflection layer, the diffusion barrier, and the APL is about 1 nm-about 1000 nm.

21. The multiple reflection layer electrode of claim 1, wherein a stack resultant structure composed of the reflection layer, the diffusion barrier, and the APL is annealed at about 300° C.-about 600° C.

22. A compound semiconductor light emitting device comprising:
   an n-type electrode;
   an n-type semiconductor layer;
   an active layer;
   a p-type semiconductor layer; and
   a p-type electrode, wherein the p-type electrode is the multiple reflection layer electrode of claim 1.

* * * * *